(12) United States Patent
Koide

(10) Patent No.: US 9,705,474 B2
(45) Date of Patent: Jul. 11, 2017

(54) COMPLEX BAND PASS FILTER AND RECEIVER

(71) Applicant: Kabushiki Kaisha Toshiba, Minato-ku, Tokyo (JP)

(72) Inventor: Naotaka Koide, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/080,695

(22) Filed: Mar. 25, 2016

(65) Prior Publication Data
US 2017/0077903 A1   Mar. 16, 2017

(30) Foreign Application Priority Data
Sep. 11, 2015   (JP) .................. 2015-180087

(51) Int. Cl.
*H03K 5/00*   (2006.01)
*H03H 11/12*  (2006.01)
*H03F 3/189*  (2006.01)
*H03F 3/45*   (2006.01)

(52) U.S. Cl.
CPC ......... *H03H 11/1217* (2013.01); *H03F 3/189* (2013.01); *H03F 3/45475* (2013.01)

(58) Field of Classification Search
CPC ................. H03H 11/04; H03H 11/365; H03H 2011/0494; H04B 1/10
USPC ................. 375/350, 316, 346; 327/552–559; 708/819
See application file for complete search history.

(56) References Cited

U.S. PATENT DOCUMENTS

| | | | | |
|---|---|---|---|---|
| 5,642,385 | A * | 6/1997 | Alberty | H03D 3/242 375/344 |
| 6,987,966 | B1 * | 1/2006 | Wu | H03B 21/01 375/147 |
| 9,148,124 | B2 * | 9/2015 | Ogasawara | H03H 11/04 |
| 2011/0189970 | A1 | 8/2011 | Ohshiro | |

FOREIGN PATENT DOCUMENTS

| | | |
|---|---|---|
| JP | 2008-177897 A | 7/2008 |
| JP | 2009-147526 A | 7/2009 |
| JP | 2011-160214 A | 8/2011 |
| JP | 2013-143726 A | 7/2013 |

\* cited by examiner

*Primary Examiner* — Dinh T Le
(74) *Attorney, Agent, or Firm* — White & Case LLP

(57) ABSTRACT

According to one embodiment, in a complex band pass filter, a second input signal to be supplied to a second active filter circuit has a substantially 90 degree phase difference from a first input signal to be supplied to a first active filter circuit. The first feedback circuit includes a first element having a first impedance and feeds back an output signal of the first active filter circuit to input side of the second active filter circuit. The second feedback circuit includes a second element having a second impedance different from the first impedance and feeds back an output signal of the second active filter circuit to input side of the first active filter circuit. The output circuit outputs an output signal according to a signal from the first active filter circuit and to a signal from the second active filter circuit.

20 Claims, 11 Drawing Sheets

COMPLEX BAND PASS FILTER AND RECEIVER

CROSS-REFERENCE TO RELATED APPLICATIONS

This application is based upon and claims the benefit of priority from Japanese Patent Application No. 2015-180087, filed on Sep. 11, 2015; the entire contents of which are incorporated herein by reference.

FIELD

Embodiments described herein relate generally to a complex band pass filter and a receiver.

BACKGROUND

Conventionally, there have been known receivers of a superheterodyne system having adopted a low-IF scheme, which makes the local oscillation frequency closer to the reception frequency, thereby making the intermediate frequency considerably lower than the reception frequency. In the low-IF scheme, because the frequencies of a desired received signal and of an image signal are close to each other, the removal of the image signal is one of the tasks in configuring receivers. A technique using a complex band pass filter to remove the image signal is disclosed.

BRIEF DESCRIPTION OF THE DRAWINGS

FIG. 10 is a diagram showing control codes for the variable resistive elements in the fourth embodiment.

DETAILED DESCRIPTION

In general, according to one embodiment, there is provided a complex band pass filter including a first active filter circuit, a second active filter circuit, a first feedback circuit, a second feedback circuit, and an output circuit. To the first active filter circuit, a first input signal to be supplied. To the second active filter circuit, a second input signal to be supplied. The second input signal has a substantially 90 degree phase difference from the first input signal. The first feedback circuit includes a first element having a first impedance and feeds back an output signal of the first active filter circuit to input side of the second active filter circuit. The second feedback circuit includes a second element having a second impedance different from the first impedance and feeds back an output signal of the second active filter circuit to input side of the first active filter circuit. The output circuit outputs an output signal according to a signal from the first active filter circuit and to a signal from the second active filter circuit.

Exemplary embodiments of a complex band pass filter will be explained below in detail with reference to the accompanying drawings. The present invention is not limited to the following embodiments.

First Embodiment

Figure 1:
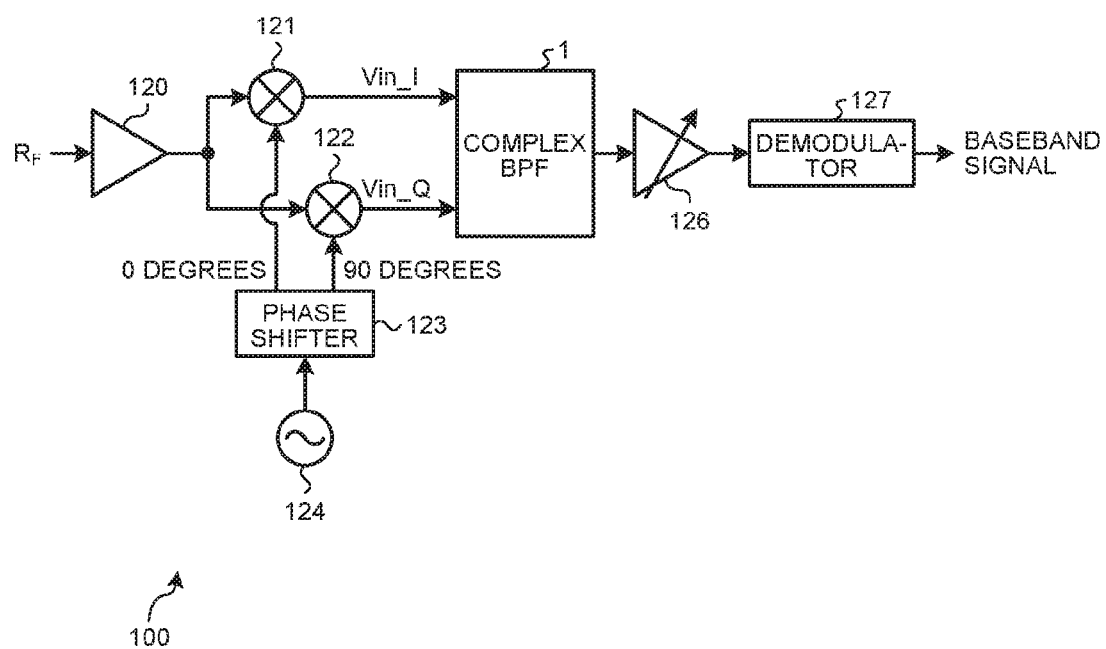
FIG. 1 is a diagram showing the configuration of a receiver to which a complex band pass filter according to a first embodiment is applied.

A complex band pass filter 1 according to the first embodiment is applied to receivers. For example, the complex band pass filter 1 is applied to a receiver 100 as shown in FIG. 1. FIG. 1 is a diagram showing the configuration of the receiver 100 to which the complex band pass filter 1 is applied.

The receiver 100 has a high-frequency amplifier circuit 120, mixers 121, 122, a local oscillator 124, a phase shifter 123, the complex band pass filter 1, a variable gain amplifier circuit 126, and a demodulator 127. The high-frequency amplifier circuit 120 amplifies a high-frequency signal $R_F$ received via an antenna (not shown). The output signal of the high-frequency amplifier circuit 120 is supplied to the mixers 121, 122. The signal of the local oscillator 124 is supplied to the phase shifter 123, and the phase shifter 123 supplies signals 90 degrees different in phase to the mixers 121, 122. In the mixers 121, 122, the signal from the high-frequency amplifier circuit 120 and the signals from the phase shifter 123 are mixed to produce a first input signal Vin_I and a second input signal Vin_Q 90 degrees different in phase from each other to supply them to the complex band pass filter 1. The output of the complex band pass filter 1 is supplied to the variable gain amplifier circuit 126. The signal amplified by the variable gain amplifier circuit 126 is supplied to the demodulator 127. The demodulator 127 outputs a demodulated baseband signal.

In the receiver 100, the local oscillator 124 may generate a signal of a local oscillation frequency closer to the reception frequency and frequency-convert the received signal (desired signal) with that signal. At this time, because an image frequency component (image signal) having the frequency opposite from that of the desired signal is also frequency-converted, the image signal interferes with the desired signal, so that the performance of the receiver 100 may be degraded. Thus, it is desired to remove the image signal.

Figure 2:
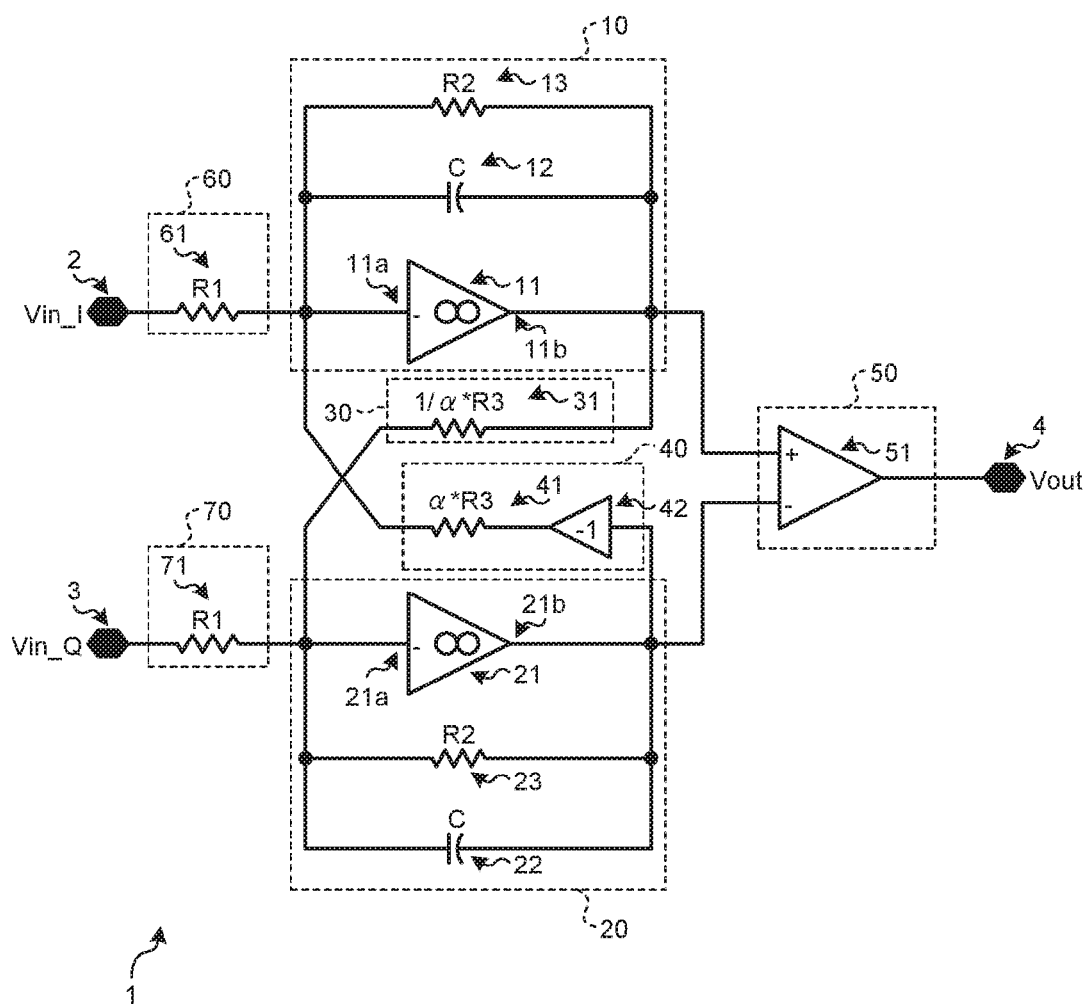
FIG. 2 is a diagram showing the configuration of the complex band pass filter according to the first embodiment.

In order to achieve the removal of the image signal, the complex band pass filter 1 is provided with feedback circuits 30, 40 cross-connected as shown in FIG. 2. FIG. 2 is a diagram showing the configuration of the complex band pass filter 1.

The complex band pass filter 1 has current conversion units 60, 70, active filter circuits 10, 20, feedback circuits 30, 40, and an output circuit 50.

The current conversion unit 60 is electrically connected between an input terminal 2 and the active filter circuit 10. The first input signal Vin_I is supplied to the input terminal 2. The current conversion unit 60 has a resistive element 61 and converts the first input signal Vin_I (a voltage) into a signal (current) Iin_I using the resistive element 61 to supply to the active filter circuit 10.

The current conversion unit 70 is electrically connected between an input terminal 3 and the active filter circuit 20. The second input signal Vin_Q is supplied to the input terminal 3. The second input signal Vin_Q is, e.g., advanced in phase by substantially 90 degrees relative to the first input signal Vin_I. The current conversion unit 70 has a resistive element 71 and converts the second input signal Vin_Q (a voltage) into a signal (current) Iin_Q using the resistive element 71 to supply to the active filter circuit 20.

The active filter circuit 10 is electrically connected between the current conversion unit 60 and the output circuit 50. The active filter circuit 10 filters the signal Iin_I supplied from the current conversion unit 60 to supply to the output circuit 50. The active filter circuit 10 has an operational amplifier circuit 11, a capacitive element 12, and a resistive element 13. The operational amplifier circuit 11 is an inverting amplifier, which inverts and amplifies the input signal. The operational amplifier circuit 11 has an input terminal 11a and an output terminal 11b. The capacitive element 12 is connected at one end to the input terminal 11a and at the other end to the output terminal 11b. The resistive element 13 is connected at one end to the input terminal 11a and at the other end to the output terminal 11b.

The active filter circuit 20 is electrically connected between the current conversion unit 70 and the output circuit 50. The active filter circuit 20 filters the signal Iin_Q supplied from the current conversion unit 70 to supply to the output circuit 50. The active filter circuit 20 has an operational amplifier circuit 21, a capacitive element 22, and a resistive element 23. The operational amplifier circuit 21 is an inverting amplifier, which inverts and amplifies the input signal. The operational amplifier circuit 21 has an input terminal 21a and an output terminal 21b. The capacitive element 22 is connected at one end to the input terminal 21a and at the other end to the output terminal 21b. The resistive element 23 is connected at one end to the input terminal 21a and at the other end to the output terminal 21b.

The feedback circuit 30 is electrically connected between the active filter circuits 10 and 20 and feeds back the output signal of the active filter circuit 10 to the input side of the active filter circuit 20. The feedback circuit 30 includes a resistive element 31. The resistive element 31 is connected at one end to the output terminal 11b of the operational amplifier circuit 11 and at the other end to the input terminal 21a of the operational amplifier circuit 21.

The feedback circuit 40 is electrically connected between the active filter circuits 10 and 20 and feeds back the output signal of the active filter circuit 20 to the input side of the active filter circuit 10. The feedback circuit 40 includes a resistive element 41 and an inverting amplifier 42. The inverting amplifier 42 180-degrees inverts the phase of the signal. The resistive element 41 is connected at one end to the output terminal 21b of the operational amplifier circuit 21 via the inverting amplifier 42 and at the other end to the input terminal 11a of the operational amplifier circuit 11.

The output circuit 50 outputs an output signal Vout according to the signal from the active filter circuit 10 and the signal from the active filter circuit 20. The output circuit 50 includes a differential amplifier circuit 51. The differential amplifier circuit 51 produces a difference signal between the signal from the active filter circuit 10 and the signal from the active filter circuit 20 as the output signal Vout. The differential amplifier circuit 51 outputs the output signal Vout via an output terminal 4.

The resistance value of the resistive element 61 and the resistance value of the resistive element 71 are substantially the same value R1. The resistance value of the resistive element 13 and the resistance value of the resistive element 23 are substantially the same value R2. The capacitance value of the capacitive element 12 and the capacitance value of the capacitive element 22 are substantially the same value C.

For example, the operational amplifier circuit 11 outputs a signal obtained by 180-degrees inverting the phase of the inputted signal Iin_I. A signal not retarded in phase relative to the output signal of the operational amplifier circuit 11 is fed back to the input terminal 11a of the operational amplifier circuit 11 via the resistive element 13, and a signal retarded in phase by 90 degrees relative to the output signal of the operational amplifier circuit 11 is fed back thereto via the capacitive element 12. A signal retarded in phase by 90 degrees relative to the output signal of the operational amplifier circuit 11, which results from 180-degrees inverting the phase of the signal Iin_Q advanced in phase by 90 degrees relative to the signal Iin_I by the operational amplifier circuit 21 and then 180-degrees inverting by the inverting amplifier 42, is fed back to the input terminal 11a of the operational amplifier circuit 11 via the resistive element 41. That is, one signal not retarded in phase and two signals retarded in phase by 90 degrees relative to the output signal of the operational amplifier circuit 11 are fed back to the input terminal 11a of the operational amplifier circuit 11.

The operational amplifier circuit 21 outputs a signal obtained by 180-degrees inverting the phase of the inputted signal Iin_Q. A signal not retarded in phase relative to the output signal of the operational amplifier circuit 21 is fed back to the input terminal 21a of the operational amplifier circuit 21 via the resistive element 23, and a signal retarded in phase by 90 degrees relative to the output signal of the operational amplifier circuit 21 is fed back thereto via the capacitive element 22. A signal retarded in phase by 90 degrees relative to the output signal of the operational amplifier circuit 21, which results from 180-degrees inverting the phase of the signal Iin_Q advanced in phase by 90 degrees relative to the signal Iin_I by the operational amplifier circuit 11, is fed back to the input terminal 21a of the operational amplifier circuit 21 via the resistive element 31. That is, one signal not retarded in phase and two signals retarded in phase by 90 degrees relative to the output signal of the operational amplifier circuit 21 are fed back to the input terminal 21a of the operational amplifier circuit 21.

That is, signals retarded in phase are likewise fed back in each of the operational amplifier circuit 11 on the I side and the operational amplifier circuit 21 on the Q side. Thus, the complex band pass filter 1 has a pass band characteristic whose voltage peak is offset close to a desired frequency f0 (>0) shown in FIG. 3A from the voltage peak of the pass band characteristic of a low pass filter, which is close to a frequency of zero.

For example, letting both the resistance values of the resistive element 31 and of the resistive element 41 be equal to R3, the transfer function of the complex band pass filter 1 shown in FIG. 2 can be expressed by the following equations (1), (2).

$$\frac{V_{out}}{V_{in}} = -\frac{R_2}{R_1} \times \frac{1}{1 + j(\omega - \omega_{offset})CR_2} \quad (1)$$

$$\omega_{offset} = \frac{1}{CR_3} \quad (2)$$

Meanwhile, the transfer function of the low pass filter is expressed by the following equation (3).

$$\frac{V_{out}}{V_{in}} = -\frac{R_2}{R_1} \times \frac{1}{1 + j\omega CR_2} \quad (3)$$

Figure 3A:
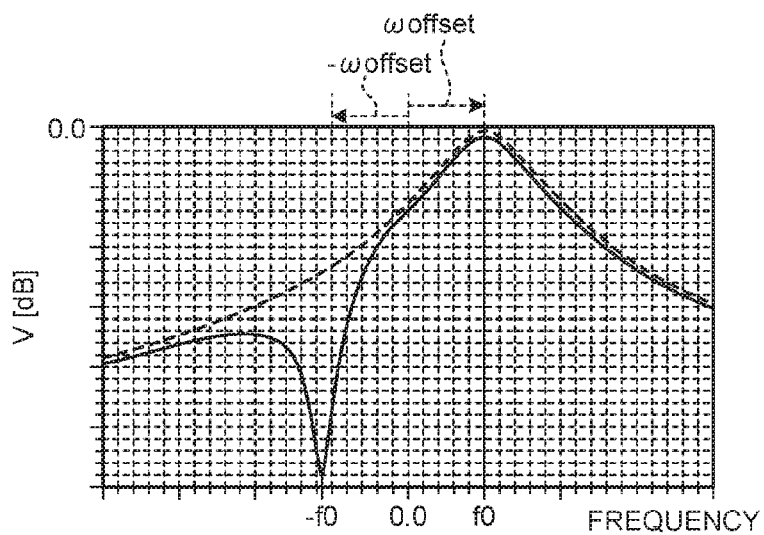
FIGS. 3A to 3C are graphs showing the operation of the complex band pass filter according to the first embodiment.

When comparing the equations (1) and (3), it is found out that $\omega_{offset}$ in the equation (1) denotes the offset amount by which the peak at the desired frequency f0 (>0) is offset from the peak frequency (≈0) of the low pass filter and is the frequency offset amount shown in FIG. 3A.

The absolute value of the transfer function of the complex band pass filter 1 is expressed by the following equation (4)

$$\left|\frac{V_{out}}{V_{in}}\right| = \frac{R_2}{R_1} \times \frac{1}{\sqrt{1 + (\omega - \omega_{offset})^2 C^2 R_2^2}} \quad (4)$$

For example, the pass band characteristic of the complex band pass filter 1 shown in FIG. 2 when α=1 is indicated by a broken line in FIG. 3A. The peak frequency of the pass band characteristic of the complex band pass filter 1 is offset by $\omega_{offset}$ from the local oscillation frequency of the local oscillator 124, and it appears as if the frequency ω in the complex band pass filter 1 is shifted to (ω−$\omega_{offset}$) in effect. That is, the pass band characteristic shows a peak in the positive frequency region where the desired reception frequency f0 exists and an attenuation characteristic in the negative frequency region where the image signal frequency −f0 (<0) exists. By using this pass band characteristic, the image signal can be removed.

One can think of increasing the number of stages (order) of the active filter circuits 10, 20 in order to improve an image rejection ratio (IRR). In this case, because the circuit scale of the complex band pass filter 1 increases, the current consumption of the complex band pass filter 1 may increase with an increase in circuit area.

Accordingly, in the present embodiment, in the complex band pass filter 1, an ingenuity is exercised in the resistance value of the resistive element 31 in the feedback circuit 30 and in the resistance value of the resistive element 41 in the feedback circuit 40 to be able to achieve the improvement in the image rejection ratio (IRR) with a small number of stages (order) of the active filter circuits 10, 20.

Specifically, in the complex band pass filter 1, the resistance value (first impedance) of the resistive element 31 in the feedback circuit 30 and the resistance value (second impedance) of the resistive element 41 in the feedback circuit 40 are different. The resistance value of the resistive element 31 is greater than that of the resistive element 41. For example, the resistance value of the resistive element 31 is given by (1/α)×R3, and the resistance value of the resistive element 41 is given by α×R3, where α is a number smaller than one.

Thus, as to the Ich output outputted from the active filter circuit 10 and the Qch output outputted from the active filter circuit 20, the phase difference of the image signal can be selectively varied to zero degrees while the phase difference of the desired wave remains at 90 degrees. As a result, by the output circuit 50 taking the difference between the Ich output and the Qch output, the image signal can be selectively removed by canceling-out.

More specifically, letting the resistance value of the resistive element 31 be denoted by (1/α)×R3 and the resistance value of the resistive element 41 be denoted by α×R3, the transfer function of the complex band pass filter 1 shown in FIG. 2 can be expressed by the following equation (5)

$$\frac{V_{out}}{V_{in}} = -\frac{R_2}{R_1} \times \frac{1}{1 + j(\omega - \omega_{offset})CR_2} \times H \quad (5)$$

The $\omega_{offset}$ of the equation (5) is expressed by the equation (2). The H of the equation (5) denotes part of the transfer function improved by the present embodiment. Hereinafter the H denoting the improved part of the transfer function is called an improvement transfer function. The improvement transfer function H is expressed by the following equation (6).

$$H = \frac{1 - j + j\left\{\omega(1-j) + \omega_{offset}\left(\frac{1}{\alpha} - j\alpha\right)\right\}CR_2}{1 + j(\omega + \omega_{offset})CR_2} \quad (6)$$

The absolute value |H| of the improvement transfer function H of the complex band pass filter 1 is expressed by the following equation (7).

$$|H| = \frac{\sqrt{\{1 + (\omega + \alpha\omega_{offset})CR_2\}^2 + \left\{1 - \left(\omega + \frac{1}{\alpha}\omega_{offset}\right)CR_2\right\}^2}}{\sqrt{1 + \{(\omega + \omega_{offset})CR_2\}^2}} \quad (7)$$

Figure 3B:
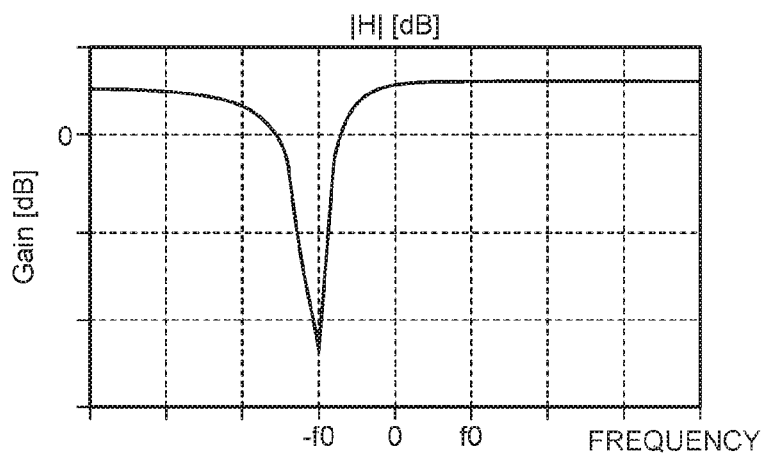

FIGS. 3A, 3B confirm the frequency characteristic when α=0.68. FIG. 3A shows the frequency characteristic obtained when observing the complex band pass filter 1, and FIG. 3B shows the frequency characteristic obtained when observing the absolute value |H| of the improvement transfer function H.

From FIG. 3B, it is found out that the gain at or near the frequency of the desired wave (f=f0) is up by, e.g., 3 dB because of the influence of IQ composition, whereas the gain at or near the image frequency (f=−f0) is sharply decreased. Thus, the pass band characteristic of the complex band pass filter 1 has a notch at or near the image frequency (f=−f0) as indicated by a solid line in FIG. 3A.

Figure 3C:
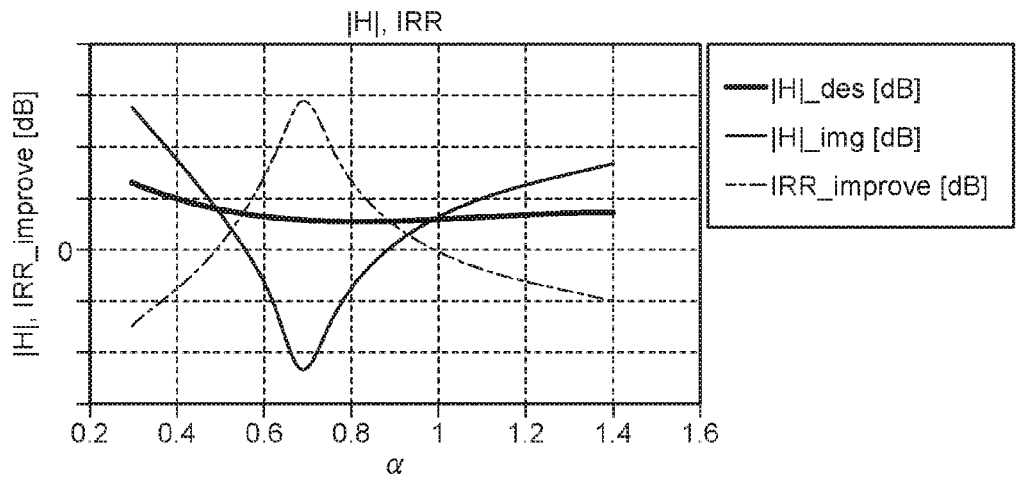

FIG. 3C is a graph showing the absolute value of the improvement transfer function and the image rejection ratio (IRR) when the desired wave or the image signal is inputted, against α (resistance coefficient). The image rejection ratio (IRR) can be improved as indicated by a dot-dashed line. For example, consider determining R2, C, R3 shown in FIG. 2 so that the complex band pass filter 1 has characteristics of the desired frequency f0=2.5 MHz and the pass band width BW=±1 MHz and obtaining values of α with which the image signal can be suppressed. In FIG. 3C, with R2=20 kΩ, C=8 pF, and R3=8 kΩ, the absolute values |H| of the improvement transfer function H for the desired wave and the image signal and the improvement amount of the image rejection ratio (IRR) calculated from the difference between the two are plotted against α, which varies. From FIG. 3C, it is found out that, if a is a number greater than 0.5 and smaller than 1, the image rejection ratio (IRR) is greater than zero, so that the image signal can be suppressed. Further, it is found out that, when α is at or close to 0.68, the image signal can be minimized.

Here, in order to examine change in the phases of the IQ outputs, the phase is calculated from the transfer function of each of the Ich and Qch. The transfer functions of the Ich and Qch are expressed by the equations (8), (9) below, $$\frac{V_{out\_I}}{V_{in}} = H_{\_com} \times \left[ 1 + \left( \omega^2 + \frac{2}{\alpha} \omega \omega_{offset} + \omega_{offset}^2 \right) C^2 R_2^2 - \right. \quad (8)$$

$$\left. j \left\{ \left( \omega - \frac{1}{\alpha} \omega_{offset} \right) + (\omega^2 - \omega_{offset}^2) \left( \omega + \frac{1}{\alpha} \omega_{offset} \right) C^2 R_2^2 \right\} CR_2 \right]$$

$$\frac{V_{out\_Q}}{V_{in}} = \quad (9)$$

$$H_{\_com} \times [\{(\omega - \alpha \omega_{offset}) + (\omega^2 - \omega_{offset}^2)(\omega + \alpha \omega_{offset}) C^2 R_2^2 \} CR_2 +$$

$$j\{1 + (\omega^2 + 2\alpha \omega \omega_{offset} + \omega_{offset}^2) C^2 R_2^2\}]$$

The improvement transfer function H_com common to the equations (8), (9) is expressed by the following equation (10).

$$H_{\_com} = -\frac{R_2}{R_1} \times \frac{1}{[1 + \{(\omega + \omega_{offset}) CR_2\}^2] \cdot [1 + \{(\omega - \omega_{offset}) CR_2\}^2]} \quad (10)$$

The phases of the IQ outputs are given by the equations (11), (12) respectively.

$$\psi_I = \tan^{-1} \left[ \frac{-\left\{ \left( \omega - \frac{1}{\alpha} \omega_{offset} \right) + (\omega^2 - \omega_{offset}^2) \left( \omega + \frac{1}{\alpha} \omega_{offset} \right) C^2 R_2^2 \right\} CR_2}{1 + \left( \omega^2 + \frac{2}{\alpha} \omega \omega_{offset} + \omega_{offset}^2 \right) C^2 R_2^2} \right] \quad (11)$$

$$\psi_Q = \tan^{-1} \left[ \frac{1 + \left( \omega^2 + \frac{2}{\alpha} \omega \omega_{offset} + \omega_{offset}^2 \right) C^2 R_2^2}{\{(\omega - \alpha \omega_{offset}) + (\omega^2 - \omega_{offset}^2)(\omega + \alpha \omega_{offset}) C^2 R_2^2\} CR_2} \right] \quad (12)$$

Figure 4:
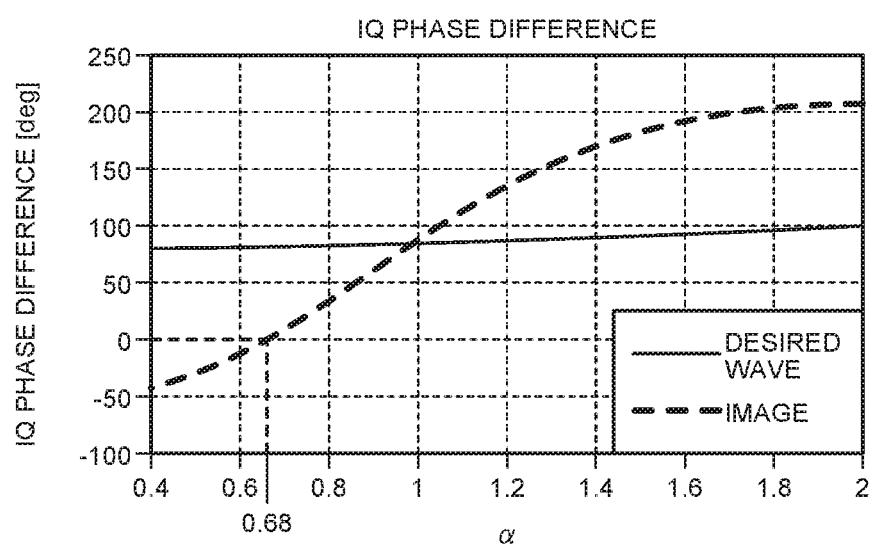
FIG. 4 is a graph showing the operation of the complex band pass filter according to the first embodiment.

The difference (phase difference) between $\psi_I$ and $\psi_Q$ is calculated from the equations (11) and (12), and FIG. 4 shows the IQ output phase differences for the desired wave and the image signal plotted against α, which varies. FIG. 4 is a graph showing the IQ output phase difference for each of the desired wave and the image signal. From FIG. 4, it is found out that the desired wave keeps the IQ phase difference at almost 90 degrees, whereas that of the image signal is at zero degrees at or near α=0.68, so that the effect of image canceling can be obtained by the differential amplifier circuit 51 taking the difference between the Ich output and the Qch output.

As described above, in the first embodiment, in the complex band pass filter 1, the resistance value (first impedance) of the resistive element 31 in the feedback circuit 30 and the resistance value (second impedance) of the resistive element 41 in the feedback circuit 40 are different. The resistance value of the resistive element 31 is greater than that of the resistive element 41. The resistance value of the resistive element 31 is given by (1/α)×R3, and the resistance value of the resistive element 41 is given by α×R3, where α is a number smaller than one. Thus, as to the Ich output outputted from the active filter circuit 10 and the Qch output outputted from the active filter circuit 20, the phase difference of the image signal can be selectively varied to substantially zero degrees while that of the desired wave remains at 90 degrees. As a result, by the output circuit 50 taking the difference between the Ich output and the Qch output, the image signal can be selectively removed by canceling-out. That is, the image rejection ratio (IRR) can be efficiently improved while suppressing the number of stages (order) of the active filter circuits 10, 20 to a small number.

Thus, the current consumption and circuit area of the complex band pass filter 1 can be reduced.

It should be noted that, although the embodiment illustrates the case where the complex band pass filter 1 is of a voltage input type, if the complex band pass filter 1 is of a current input type, the complex band pass filter 1 may be configured to have the current conversion units 60, 70 omitted.

Or in a complex band pass filter 1i, the phase difference of the image signal between the Ich output and the Qch output may be made to be at substantially 180 degrees, and an output circuit 50i may be configured to add the Ich output and the Qch output. In the complex band pass filter 1i, by appropriately adjusting the value of α, the phase difference of the image signal between the Ich output and the Qch output can be made to be at substantially 180 degrees. For example, in the case where R2=20 kΩ, C=8 pF, and R3=8 kΩ, by making a be at or close to 1/0.68, the phase difference of the image signal between the Ich output and the Qch output can be made to be at substantially 180 degrees.

Figure 5:
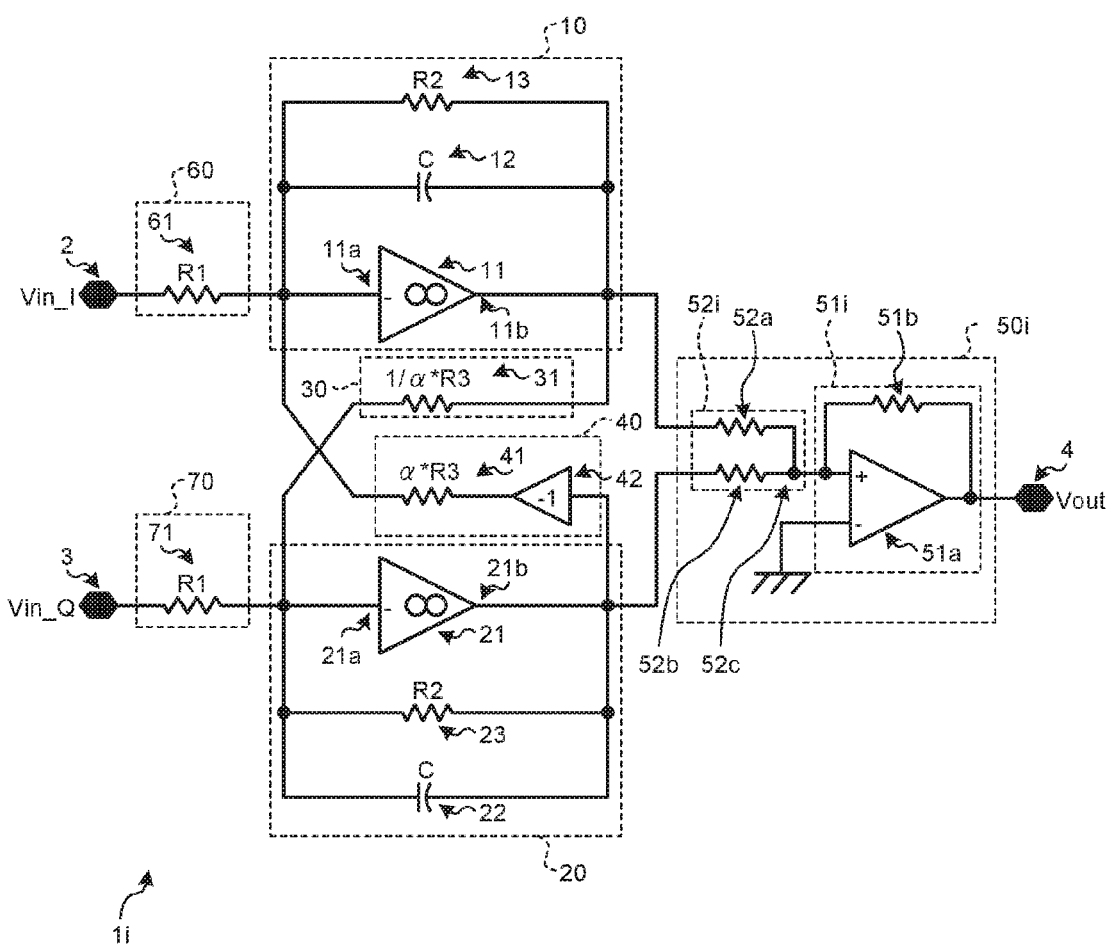
FIG. 5 is a diagram showing the configuration of a complex band pass filter according to a modified example of the first embodiment.

In this case, the complex band pass filter 1i may have the output circuit 50i as shown in FIG. 5 instead of the output circuit 50 (see FIG. 2). The output circuit 50i has an adder circuit 52i and an amplifier circuit 51i. The adder circuit 52i has resistive elements 52a and 52b. The resistive element 52a is connected at one end to the output terminal 11b of the operational amplifier circuit 11 and at the other end to an adder node 52c. The resistive element 52b is connected at one end to the output terminal 21b of the operational amplifier circuit 21 and at the other end to the adder node 52c.

The adder circuit 52i converts the signal (Ich output) from the active filter circuit 10 and the signal (Qch output) from the active filter circuit 20 into currents using the resistive elements 52a and 52b respectively. The adder circuit 52i adds the two currents after the conversion at the adder node 52c to output the addition resulting current. Thus, the image components contained in the signals can cancel out before amplified by the amplifier circuit 51i. The amplifier circuit 51i has a differential amplifier circuit 51a and a resistive element 51b. The resistive element 51b is connected at one end to the output terminal of the differential amplifier circuit 51a and at the other end to the non-inversion input terminal of the differential amplifier circuit 51a. The amplifier circuit 51i has its inversion input terminal connected to ground potential. The amplifier circuit 51i receives the addition resulting current from the adder circuit 52i and amplifies the signal corresponding to the current according to the ratio of the resistance value of the resistive element 51b to those of the resistive elements 52a, 52b to output the amplification resulting signal Vout via the output terminal 4.

As described above, in the output circuit 50i, the adder circuit 52i can add the signal from the active filter circuit 10 and the signal from the active filter circuit 20, so that the image components contained in the signals can cancel out before amplified by the amplifier circuit 51i. Thus, the image signal can be efficiently removed by canceling-out, so that the image rejection ratio (IRR) can be further improved.

Second Embodiment

Next, a complex band pass filter 201 according to the second embodiment will be described. Description will be made below focusing on the differences from the first embodiment.

While the first embodiment illustrates the case where the complex band pass filter 1 is of a single-ended configuration, the second embodiment will illustrate the case where the complex band pass filter 201 is of a differential configuration.

Figure 6:
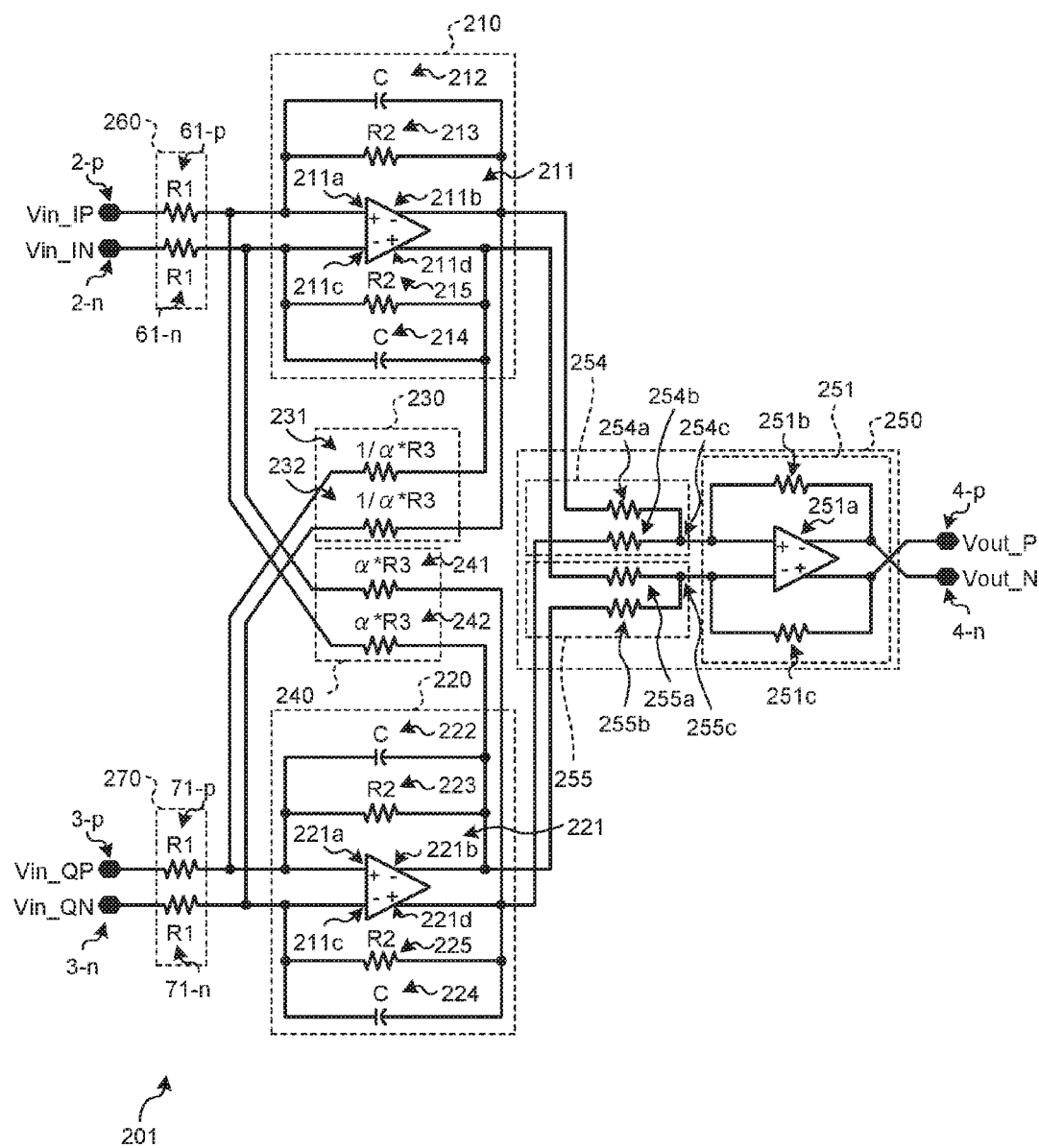
FIG. 6 is a diagram showing the configuration of a complex band pass filter according to a second embodiment.

Specifically, the complex band pass filter 201 has current conversion units 260, 270, active filter circuits 210, 220, feedback circuits 230, 240, and an output circuit 250 as shown in FIG. 6.

The current conversion unit 260 has resistive elements 61-p, 61-n and converts input signals Vin_IP, Vin_IN (voltages) inputted via input terminals 2-p, 2-n into signals Iin_IP, Iin_IN (currents) using the resistive elements 61-p, 61-n to supply to the active filter circuit 210.

The current conversion unit 270 has resistive elements 71-p, 71-n and converts input signals Vin_QP, Vin_QN (voltages) inputted via input terminals 3-p, 3-n into signals Iin_QP, Iin_QN (currents) using the resistive elements 71-p, 71-n to supply to the active filter circuit 220.

The active filter circuit 210 has a balanced amplifier circuit 211, capacitive elements 212, 214, and resistive elements 213, 215. The balanced amplifier circuit 211 has a non-inversion input terminal 211a, an inversion input terminal 211c, an inversion output terminal 211b, and a non-inversion output terminal 211d. The capacitive element 212 is connected at one end to the non-inversion input terminal 211a and at the other end to the inversion output terminal 211b. The resistive element 213 is connected at one end to the non-inversion input terminal 211a and at the other end to the inversion output terminal 211b. The capacitive element 214 is connected at one end to the inversion input terminal 211c and at the other end to the non-inversion output terminal 211d. The resistive element 215 is connected at one end to the inversion input terminal 211c and at the other end to the non-inversion output terminal 211d.

The active filter circuit 220 has a balanced amplifier circuit 221, capacitive elements 222, 224, and resistive elements 223, 225. The balanced amplifier circuit 221 has a non-inversion input terminal 221a, an inversion input terminal 221c, an inversion output terminal 221b, and a non-inversion output terminal 221d. The capacitive element 222 is connected at one end to the non-inversion input terminal 221a and at the other end to the inversion output terminal 221b. The resistive element 223 is connected at one end to the non-inversion input terminal 221a and at the other end to the inversion output terminal 221b. The capacitive element 224 is connected at one end to the inversion input terminal 221c and at the other end to the non-inversion output terminal 221d. The resistive element 225 is connected at one end to the inversion input terminal 221c and at the other end to the non-inversion output terminal 221d.

The feedback circuit 230 includes resistive elements 231, 232. The resistive element 231 is connected at one end to the non-inversion output terminal 211d of the balanced amplifier circuit 211 and at the other end to the non-inversion input terminal 221a of the balanced amplifier circuit 221. The resistive element 232 is connected at one end to the inversion output terminal 211b of the balanced amplifier circuit 211 and at the other end to the inversion input terminal 221c of the balanced amplifier circuit 221.

The feedback circuit 240 includes resistive elements 241, 242. The resistive element 241 is connected at one end to the non-inversion output terminal 221d of the balanced amplifier circuit 221 and at the other end to the inversion input terminal 211c of the balanced amplifier circuit 211. The resistive element 242 is connected at one end to the inversion output terminal 221b of the balanced amplifier circuit 221 and at the other end to the non-inversion input terminal 211a of the balanced amplifier circuit 211. That is, the feedback circuit 240 feeds back the P side output of the active filter circuit 220 to the N side input of the active filter circuit 210 and feeds back the N side output of the active filter circuit 220 to the P side input of the active filter circuit 210, thereby 180-degrees inverting the phase of the signal to be fed back. Thus, the inverting amplifier 42 (see FIG. 2) is omitted from the feedback circuit 240.

The output circuit 250 has difference circuits 254, 255 and a differential amplifier circuit 251. The difference circuit 254 has resistive elements 254a, 254b. The resistive element 254a is connected at one end to the inversion output terminal 211b of the balanced amplifier circuit 211 and at the other end to a difference node 254c. The resistive element 254b is connected at one end to the non-inversion output terminal 221d of the balanced amplifier circuit 221 and at the other end to the difference node 254c. The difference circuit 254 converts the N side signal from the active filter circuit 210 and the P side signal from the active filter circuit 220 into currents using the resistive elements 254a, 254b respectively. The difference circuit 254 adds the two currents (of opposite phases) after the conversion at the difference node 254c to take the difference and outputs the difference resulting current. The difference resulting current can be regarded as the signal obtained by subtracting the N side signal from the P side signal. Thus, the image component contained in the P side signal can be canceled out before amplified by the differential amplifier circuit 251.

Likewise, the difference circuit 255 has resistive elements 255a, 255b. The resistive element 255a is connected at one end to the non-inversion output terminal 211d of the balanced amplifier circuit 211 and at the other end to a difference node 255c. The resistive element 255b is connected at one end to the inversion output terminal 221b of the balanced amplifier circuit 221 and at the other end to the difference node 255c. The difference circuit 255 converts the P side signal from the active filter circuit 210 and the N side signal from the active filter circuit 220 into currents using the resistive elements 255a, 255b respectively. The difference circuit 255 adds the two currents (of opposite phases) after the conversion at the difference node 255c to take the difference and outputs the difference resulting current. The difference resulting current can be regarded as the signal obtained by subtracting the P side signal from the N side signal. Thus, the image component contained in the N side signal can be canceled out before amplified by the differential amplifier circuit 251.

The differential amplifier circuit 251 has a balanced amplifier circuit 251a and resistive elements 251b, 251c. The resistive element 251b is connected at one end to the inversion output terminal of the balanced amplifier circuit 251a and at the other end to the non-inversion input terminal of the balanced amplifier circuit 251a. The resistive element 251c is connected at one end to the non-inversion output terminal of the balanced amplifier circuit 251a and at the other end to the inversion input terminal of the balanced amplifier circuit 251a. The differential amplifier circuit 251 receives the difference resulting current from the difference circuit 254 and amplifies the signal corresponding to the current according to the ratio of the resistance value of the resistive element 251b to those of the resistive elements 254a, 254b to output the amplification resulting signal Vout_N via the output terminal 4-n. The differential amplifier circuit 251 receives the difference resulting current from the difference circuit 255 and amplifies the signal corresponding to the current according to the ratio of the resistance value of the resistive element 251c to those of the resistive elements 255a, 255b to output the amplification resulting signal Vout_P via the output terminal 4-p.

In the complex band pass filter 201, the resistance value (first impedance) of the resistive elements 231, 232 in the feedback circuit 230 and the resistance value (second impedance) of the resistive elements 241, 242 in the feedback circuit 240 are different. The resistance value of the resistive elements 231, 232 is greater than that of the resistive elements 241, 242. For example, the resistance value of the resistive elements 231, 232 is given by $(1/\alpha) \times R3$, and the resistance value of the resistive elements 241, 242 is given by $\alpha \times R3$, where $\alpha$ is a number smaller than one.

As described above, in the second embodiment, the complex band pass filter 201 has a differential configuration, and each of the Ich output and the Qch output can be a differential signal (a pair of P side and N side signals). Thus, the output circuit 250 acquires signals of opposite phases from the Ich output and the Qch output and adds those currents to take the difference between the Ich output and the Qch output, so that each of the image components contained in the P side signal and the N side signal can be canceled out before amplified by the differential amplifier circuit 251. Thus, the image signal can be efficiently removed by canceling-out, so that the image rejection ratio (IRR) can be further improved.

It should be noted that a complex band pass filter 201i may be configured such that the phase difference of the image signal between the Ich output and the Qch output is made to be at substantially 180 degrees with an output circuit 250i adding the Ich output and the Qch output. In the complex band pass filter 201i, by appropriately adjusting the value of a, the phase difference of the image signal between the Ich output and the Qch output can be made to be at substantially 180 degrees. For example, in the case where R2=20 k$\Omega$, C=8 pF, and R3=8 k$\Omega$, by making a be at or close to 1/0.68, the phase difference of the image signal between the Ich output and the Qch output can be made to be at substantially 180 degrees.

Figure 7:
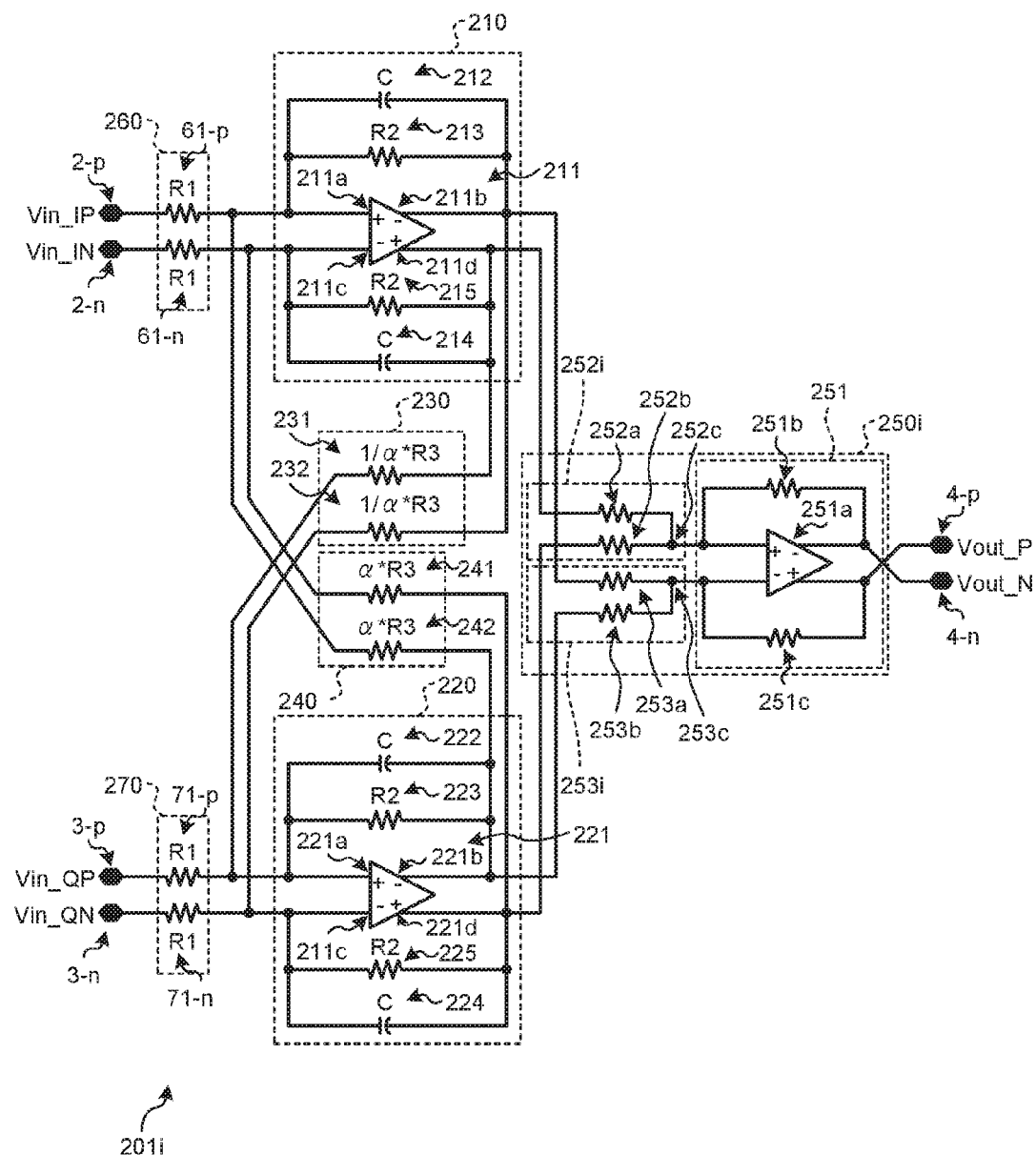
FIG. 7 is a diagram showing the configuration of a complex band pass filter according to a modified example of the second embodiment.

In this case, the complex band pass filter 201i may have the output circuit 250i as shown in FIG. 7 instead of the output circuit 250 (see FIG. 6). The output circuit 250i has adder circuits 252i, 253i and a differential amplifier circuit 251i. The adder circuit 252i has resistive elements 252a and 252b. The resistive element 252a is connected at one end to the non-inversion output terminal 211d of the balanced amplifier circuit 211 and at the other end to an adder node 252c. The resistive element 252b is connected at one end to the non-inversion output terminal 221d of the balanced amplifier circuit 221 and at the other end to the adder node 252c. The adder circuit 252i converts the P side signal from the active filter circuit 210 and the P side signal from the active filter circuit 220 into currents using the resistive elements 252a, 252b respectively. The adder circuit 252i adds the two currents after the conversion at the adder node 252c and outputs the P side addition resulting current. Thus, the image components contained in the P side signals can cancel out before amplified by the differential amplifier circuit 251i.

Likewise, the adder circuit 253i is connected to the inversion output terminal 211b of the balanced amplifier circuit 211 of the active filter circuit 210 and to the inversion output terminal 221b of the balanced amplifier circuit 221 of the active filter circuit 220. The adder circuits 253i have resistive elements 253a and 253b. The resistive element 253a is connected at one end to the inversion output terminal 211b of the balanced amplifier circuit 211 and at the other end to an adder node 253c. The resistive element 253b is connected at one end to the inversion output terminal 221b of the balanced amplifier circuit 221 and at the other end to the adder node 253c. The adder circuit 253i converts the N side signal from the active filter circuit 210 and the N side signal from the active filter circuit 220 into currents using the resistive elements 253a, 253b respectively. The adder circuit 253i adds the two currents after the conversion at the adder node 253c and outputs the N side addition resulting current. Thus, the image components contained in the N side signals can cancel out before amplified by the differential amplifier circuit 251i.

The differential amplifier circuit 251i receives the P side addition resulting current from the adder circuit 252i and amplifies the signal corresponding to the current according to the ratio of the resistance value of the resistive element 251b to those of the resistive elements 252a, 252b to output the amplification resulting signal Vout_N via the output terminal 4-n. The differential amplifier circuit 251i receives the N side addition resulting current from the adder circuit 253i and amplifies the signal corresponding to the current according to the ratio of the resistance value of the resistive element 251c to those of the resistive elements 253a, 253b to output the amplification resulting signal Vout_P via the output terminal 4-p.

In this way, in the output circuit 250i, the adder circuits 252i 253i can add the signal from the active filter circuit 210 and the signal from the active filter circuit 220, so that the image components contained in the signals can cancel out before amplified by the amplifier circuit 251i. Thus, the image signal can be efficiently removed by canceling-out, so that the image rejection ratio (IRR) can be further improved.

Third Embodiment

Next, a complex band pass filter 301 according to the third embodiment will be described. Description will be made below focusing on the differences from the second embodiment.

While in the second embodiment one stage (first order) of the active filter circuits 210, 220 is provided, in the third embodiment multiple stages (an order higher than one) of the active filter circuits 210, 220 is provided.

Figure 8:
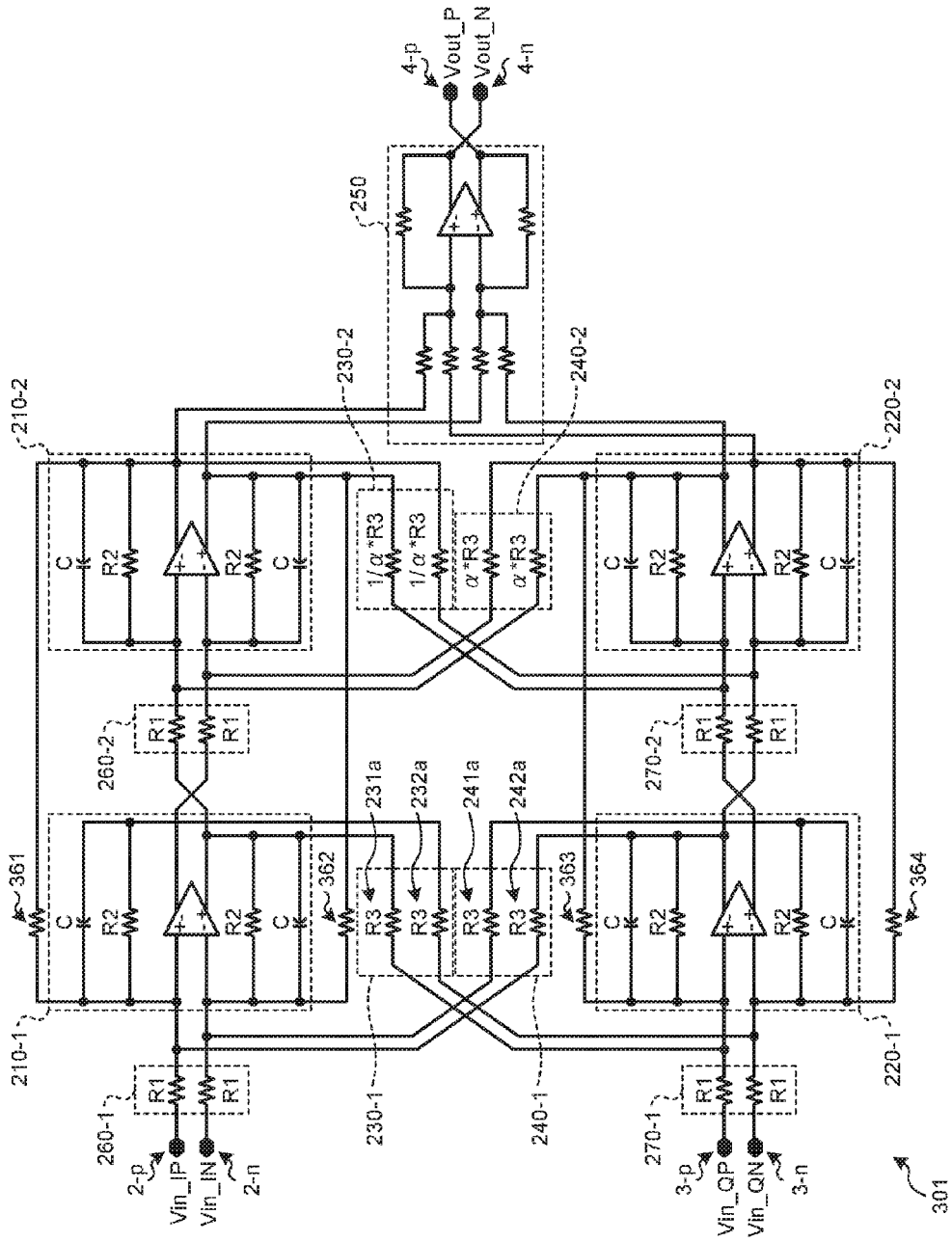
FIG. 8 is a diagram showing the configuration of a complex band pass filter according to a third embodiment.

Specifically, as shown in FIG. 8, in the complex band pass filter 301, current conversion units 260-1, 270-1, 260-2, 270-2, active filter circuits 210-1, 220-1, 210-2, 220-2, and feedback circuits 230-1, 240-1, 230-2, 240-2, which are basically similar to in FIG. 6, are provided a plurality of times in a repeated pattern between input terminals 2-p, 2-n, 3-p, 3-n and the output circuit 250. FIG. 8 illustrates a two-stage (second order) configuration.

Note that, from among the feedback circuits 230, 240, the feedback circuits 230-2, 240-2 of the final stage are configured in similar way to in FIG. 6 and that, in the feedback circuits 230-1, 240-1 of non-final stages, the resistance values of resistive elements 231a, 232a, 241a, 242a are set at substantially the same value R3. Further, resistive elements 361 to 364 for feeding back the outputs of the final stage of active filter circuits 210-2, 220-2 to the first stage of active filter circuits 210-1, 220-1 are additionally provided.

As described above, in the third embodiment, the feedback circuits 230-2, 240-2 of the final stage have similar configuration to in the second embodiment, and hence similar image rejection ratio (IRR) to in the second embodiment can be achieved.

Fourth Embodiment

Next, a complex band pass filter 201 according to the fourth embodiment will be described. Description will be made below focusing on the differences from the second embodiment.

In the second embodiment, the resistive elements 231, 232 of the feedback circuit 230 and the resistive elements 241, 242 of the feedback circuit 240 have fixed resistance values respectively.

However, the adjustment of the desired frequency f0 may be required of the complex band pass filter 201. Accordingly, in the fourth embodiment, by making the resistance values of the resistive elements 231, 232 of the feedback circuit 230 and the resistive elements 241, 242 of the feedback circuit 240 variable, the adjustment of the desired frequency f0 is enabled.

Figure 9:
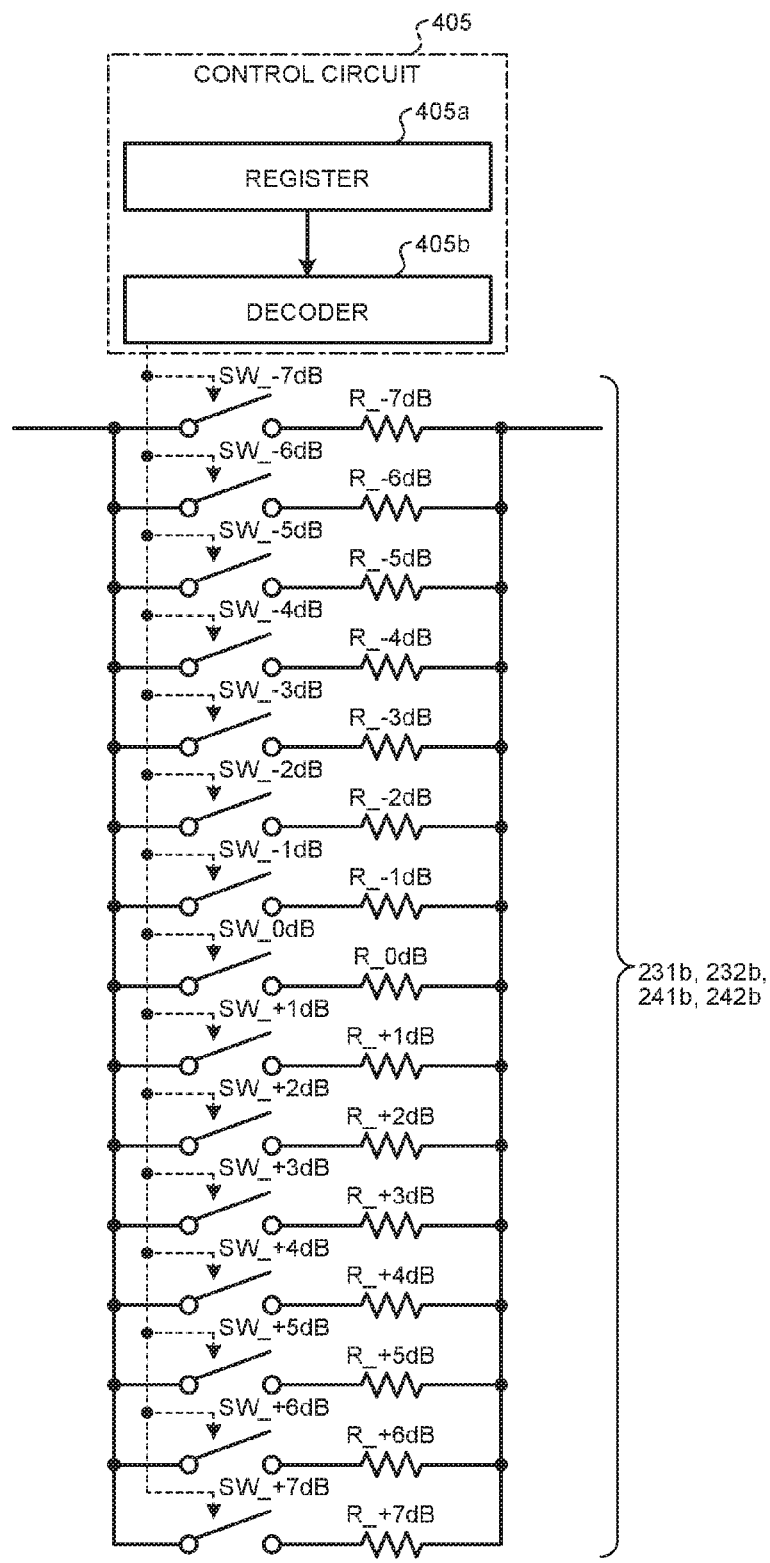
FIG. 9 is a diagram showing the configuration of a variable resistive element in a fourth embodiment.

Specifically, the resistive elements 231, 232, 241, 242 shown in FIG. 6 are replaced with variable resistive elements 231b, 232b, 241b, 242b having the configuration as shown in FIG. 9.

In the second embodiment, for example, the resistance value of the resistive elements 231, 232 can be given by $(1/\alpha) \times R3$, and the resistance value of the resistive elements 241, 242 can be given by $\alpha \times R3$. In this case, if the resistive elements 231, 232, 241, 242 are replaced with variable resistive elements 231b, 232b, 241b, 242b, the ratio of the resistance value of the variable resistive elements 231b, 232b to that of the variable resistive elements 241b, 242b may deviate from an appropriate ratio of $1/\alpha:\alpha$. If the ratio of the resistance value of the variable resistive elements 231b, 232b to that of the variable resistive elements 241b, 242b deviates from an appropriate ratio of $1/\alpha:\alpha$, then it is difficult to make the pass band characteristic of the complex band pass filter 201 have a notch at or near the image frequency, so that it may be difficult to improve the image rejection ratio (IRR).

In the fourth embodiment, an ingenuity is exercised in change operation of the variable resistive elements 231b, 232b and 241b, 242b, to be able to realize both the notch and the f0 adjustment.

In this case, if the variable resistive elements 231b, 232b and 241b, 242b are simply made linear-step variable, the resistance ratio may deviate from $1/\alpha:\alpha$ appropriate for the notch.

Accordingly, in the fourth embodiment, cross-connected resistances are made adjustable by steps in dB. Resistive elements R_+7 dB to R_−7 dB are connected in parallel via switches SW_+7 dB to SW_−7 dB between one end and the other end of each variable resistive element 231b to 242b. The resistive elements R_+7 dB to R_−7 dB have resistance values in the ratio (in dB) corresponding to their suffix to that of a reference resistive element R_0 dB.

Figure 10:
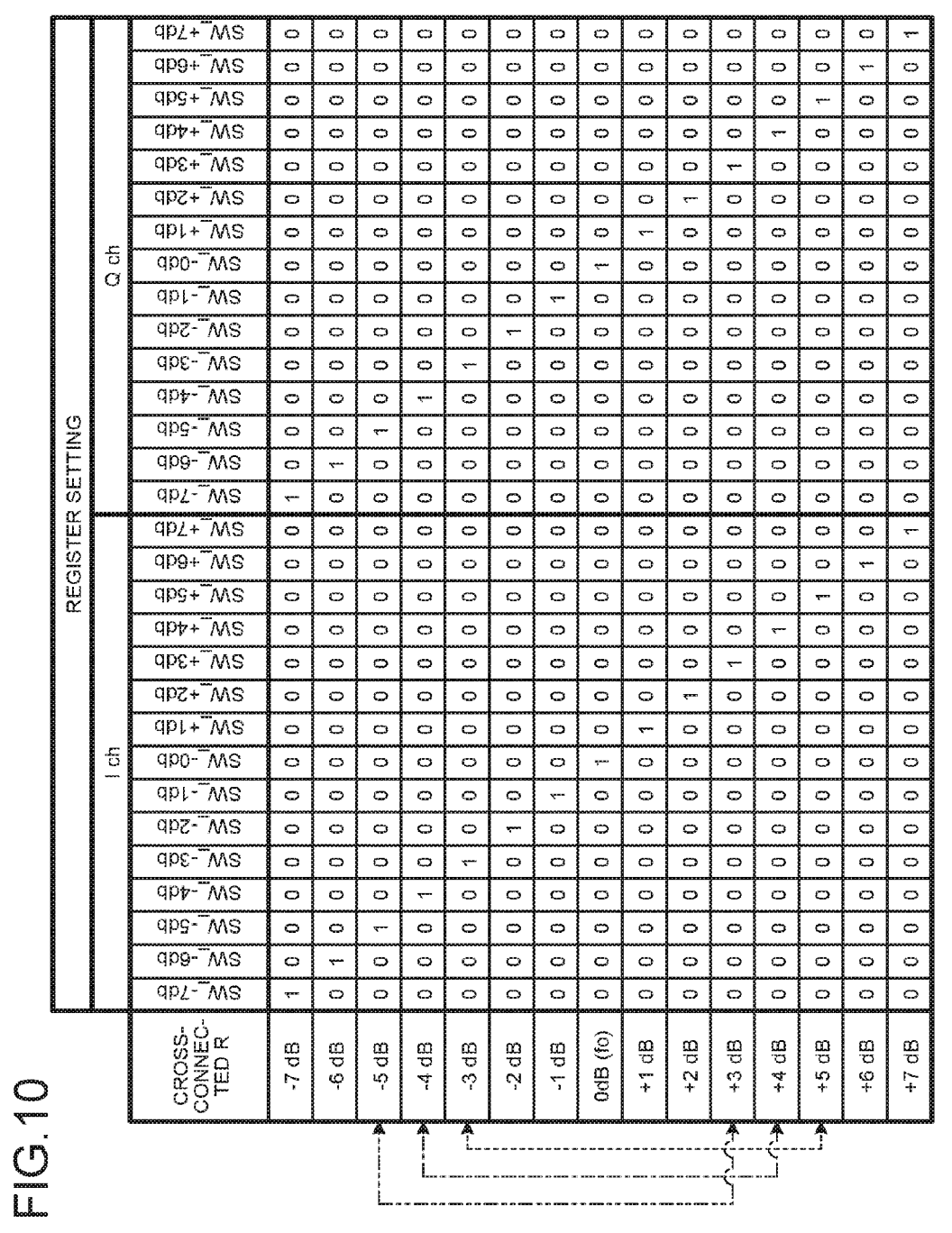

The variable resistive elements 231b, 232b, 241b, 242b can be controlled by a control circuit 405. The control circuit 405 has a register 405a and a decoder 405b. The register 405a has, for example, a truth table as shown in FIG. 10. The control circuit 405 reads the truth table from the register 405a to supply to the decoder 405b, and the decoder 405b generates control signals to turn on predetermined switches to supply to the variable resistive elements 231b, 232b, 241b, 242b.

For example, after the notch is set appropriately (e.g., optimally), by increasing/decreasing each of the IQ resistances by steps of x dB (x is an arbitrary number), f0 can be moved with keeping an appropriate ratio. For example, where the ratio value is $1/\alpha \div \alpha = 1/\alpha^2 = 8$ dB, the resistance values of the variable resistive elements 231b, 232b and 241b, 242b can be increased/decreased with keeping the difference of 8 dB.

In the case indicated by a broken-line arrow in FIG. 10, the control circuit 405 selectively turns on the switch SW_+5 dB for the variable resistive elements 231b, 232b to set the variable resistive elements 231b, 232b at +5 dB and selectively turns on the switch SW_−3 dB for the variable resistive elements 241b, 242b to set the variable resistive elements 241b, 242b at −3 dB.

In the case indicated by a dot-dashed arrow in FIG. 10, the control circuit 405 selectively turns on the switch SW_+4 dB for the variable resistive elements 231b, 232b to set the variable resistive elements 231b, 232b at +4 dB and selectively turns on the switch SW_−4 dB for the variable resistive elements 241b, 242b to set the variable resistive elements 241b, 242b at −4 dB.

In the case indicated by a two-dot-dashed arrow in FIG. 10, the control circuit 405 selectively turns on the switch SW_+3 dB for the variable resistive elements 231b, 232b to set the variable resistive elements 231b, 232b at +3 dB and selectively turns on the switch SW_−5 dB for the variable resistive elements 241b, 242b to set the variable resistive elements 241b, 242b at −5 dB.

Figure 11A:
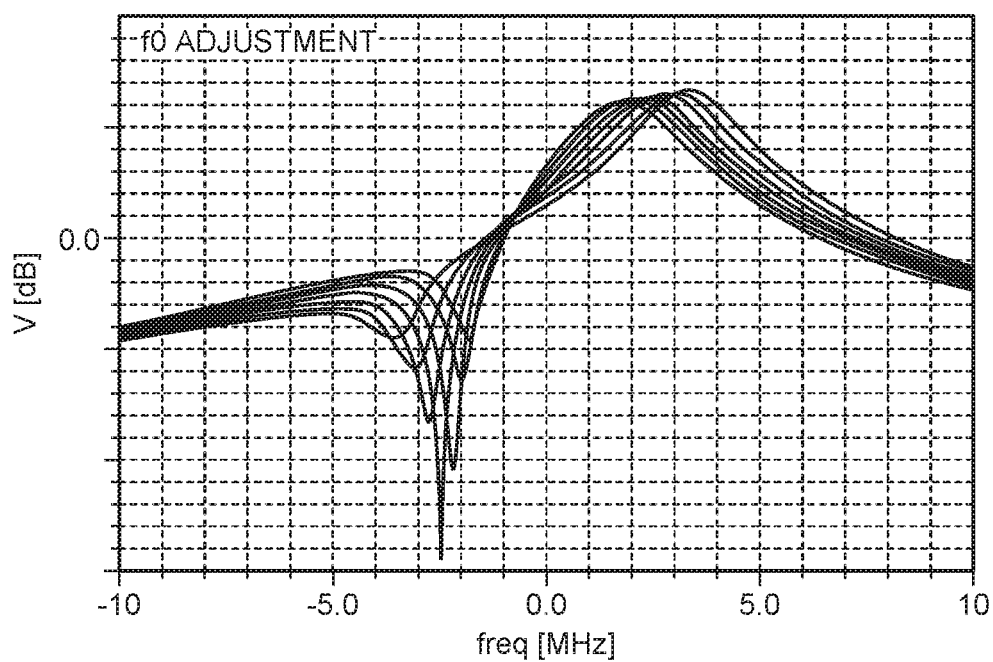
FIGS. 11A, 11B are graphs showing the operation of the complex band pass filter according to the fourth embodiment.

Therefore, both the notch and the f0 adjustment can be realized as shown in FIG. 11A without giving up the adjustment function nor making circuits more complex. FIG. 11A is a graph showing the operation of the complex band pass filter 201 when the desired frequency f0 is being adjusted.

Figure 11B:
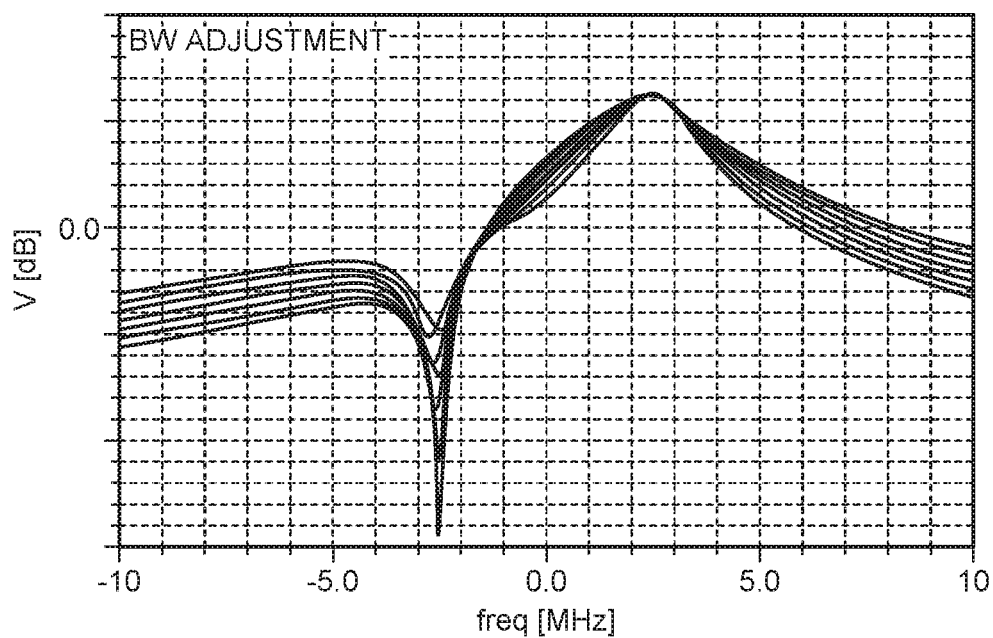

Further, by making the capacitance values of the capacitive elements 212, 214, 222, 224 in the active filter circuits 210, 220 variable, the pass band width BW of the complex band pass filter 201 becomes adjustable. In this case, when the capacitance values of the capacitive elements 212, 214, 222, 224 are changed, the desired frequency f0 also moves simultaneously, but adjustment can be made using the f0 adjustment function so that the desired frequency f0 is constant as shown in FIG. 11B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A complex band pass filter comprising:
    a first active filter circuit to which a first input signal is to be supplied;
    a second active filter circuit to which a second input signal is to be supplied, the second input signal having a substantially 90 degree phase difference from the first input signal;
    a first feedback circuit that includes a first element having a first impedance and feeds back an output signal of the first active filter circuit to an input side of the second active filter circuit;
    a second feedback circuit that includes a second element having a second impedance different from the first impedance and feeds back an output signal of the second active filter circuit to an input side of the first active filter circuit; and an output circuit that outputs an output signal according to a signal from the first active filter circuit and to a signal from the second active filter circuit.

2. The complex band pass filter according to claim 1, wherein
the first impedance is greater than the second impedance.

3. The complex band pass filter according to claim 2, wherein
the first element includes a first resistive element having a first resistance value, and the second element includes a second resistive element having a second resistance value, and
wherein the first resistance value is one obtained by multiplying a predetermined resistance value by $1/\alpha$, and the second resistance value is one obtained by multiplying the predetermined resistance value by $\alpha$, where $\alpha$ is a number smaller than one.

4. The complex band pass filter according to claim 1, wherein
the output circuit has a differential amplifier circuit that produces a difference signal between a signal from the first active filter circuit and a signal from the second active filter circuit as the output signal.

5. The complex band pass filter according to claim 1, wherein
the output circuit has an adder circuit that produces a result of adding a signal from the first active filter circuit and a signal from the second active filter circuit as the output signal.

6. The complex band pass filter according to claim 1, wherein
each of the first active filter circuit and the second active filter circuit has:
an operational amplifier circuit having an input terminal and an output terminal;
a third resistive element connected at one end to the input terminal and at the other end to the output terminal; and
a capacitive element connected at one end to the input terminal and at the other end to the output terminal.

7. The complex band pass filter according to claim 1, wherein
the second feedback circuit further includes an inverting amplifier.

8. The complex band pass filter according to claim 1, wherein
each of the first active filter circuit and the second active filter circuit has:
a balanced amplifier circuit having an inversion input terminal, a non-inversion input terminal, an inversion output terminal, and a non-inversion output terminal;
a third resistive element connected at one end to the inversion input terminal and at the other end to the non-inversion output terminal;
a fourth resistive element connected at one end to the non-inversion input terminal and at the other end to the inversion output terminal;
a first capacitive element connected at one end to the inversion input terminal and at the other end to the non-inversion output terminal; and
a second capacitive element connected at one end to the non-inversion input terminal and at the other end to the inversion output terminal,
wherein the first element has:
a fifth resistive element connected at one end to the inversion output terminal of the balanced amplifier circuit of the first active filter circuit and at the other end to the inversion input terminal of the balanced amplifier circuit of the second active filter circuit; and
a sixth resistive element connected at one end to the non-inversion output terminal of the balanced amplifier circuit of the first active filter circuit and at the other end to the non-inversion input terminal of the balanced amplifier circuit of the second active filter circuit, and
wherein the second element has:
a seventh resistive element connected at one end to the inversion output terminal of the balanced amplifier circuit of the second active filter circuit and at the other end to the non-inversion input terminal of the balanced amplifier circuit of the first active filter circuit; and
an eighth resistive element connected at one end to the non-inversion output terminal of the balanced amplifier circuit of the second active filter circuit and at the other end to the inversion input terminal of the balanced amplifier circuit of the first active filter circuit.

9. The complex band pass filter according to claim 8, wherein
the fifth resistive element and the sixth resistive element each have a first resistance value, and
the seventh resistive element and the eighth resistive element each have a second resistance value greater than the first resistance value.

10. The complex band pass filter according to claim 9, wherein
the first resistance value is one obtained by multiplying a predetermined resistance value by $1/\alpha$, and
the second resistance value is one obtained by multiplying the predetermined resistance value by $\alpha$.

11. The complex band pass filter according to claim 8, wherein the output circuit has:
a first difference circuit connected to the inversion output terminal of the balanced amplifier circuit of the first active filter circuit and to the non-inversion output terminal of the balanced amplifier circuit of the second active filter circuit;
a second difference circuit connected to the non-inversion output terminal of the balanced amplifier circuit of the first active filter circuit and to the inversion output terminal of the balanced amplifier circuit of the second active filter circuit; and
a differential amplifier circuit that produces a pair of differential signals according to a signal from the first difference circuit and to a signal from the second difference circuit as the output signal.

12. The complex band pass filter according to claim 11, wherein
the first difference circuit has:
a first node connected to the differential amplifier circuit;
a ninth resistive element connected at one end to the inversion output terminal of the balanced amplifier circuit of the first active filter circuit and at the other end to the first node; and
a tenth resistive element connected at one end to the non-inversion output terminal of the balanced amplifier circuit of the second active filter circuit and at the other end to the first node, and
wherein the second difference circuit has:
a second node connected to the differential amplifier circuit;
an eleventh resistive element connected at one end to the non-inversion output terminal of the balanced amplifier circuit of the first active filter circuit and at the other end to the second node; and a twelfth resistive element connected at one end to the inversion output terminal of the balanced amplifier circuit of the second active filter circuit and at the other end to the second node.

13. The complex band pass filter according to claim 8, wherein
the output circuit has:
a first adder circuit connected to the non-inversion output terminal of the balanced amplifier circuit of the first active filter circuit and to the non-inversion output terminal of the balanced amplifier circuit of the second active filter circuit;
a second adder circuit connected to the inversion output terminal of the balanced amplifier circuit of the first active filter circuit and to the inversion output terminal of the balanced amplifier circuit of the second active filter circuit; and
a differential amplifier circuit that produces a pair of differential signals according to a signal from the first adder circuit and to a signal from the second adder circuit as the output signal.

14. The complex band pass filter according to claim 13, wherein
the first adder circuit has:
a first node connected to the differential amplifier circuit;
a thirteenth resistive element connected at one end to the non-inversion output terminal of the balanced amplifier circuit of the first active filter circuit and at the other end to the first node; and
a fourteenth resistive element connected at one end to the non-inversion output terminal of the balanced amplifier circuit of the second active filter circuit and at the other end to the first node, and
wherein the second adder circuit has:
a second node connected to the differential amplifier circuit;
a fifteenth resistive element connected at one end to the inversion output terminal of the balanced amplifier circuit of the first active filter circuit and at the other end to the second node; and
a sixteenth resistive element connected at one end to the inversion output terminal of the balanced amplifier circuit of the second active filter circuit and at the other end to the second node.

15. The complex band pass filter according to claim 1, wherein,
if multiple stages of active filter circuits are provided, the first and second active filter circuits provided with the first and second feedback circuits are placed at the final stage from among the multiple stages.

16. The complex band pass filter according to claim 1, wherein
the first element includes a first variable resistive element whose resistance value is changeable by steps in dB, and
the second element includes a second variable resistive element whose resistance value is changeable by steps in dB.

17. The complex band pass filter according to claim 16, wherein
the resistance values of the first and second variable resistive elements are changed such that the difference in dB between them is kept constant.

18. The complex band pass filter according to claim 16, wherein
the resistance values of the first and second variable resistive elements are changed such that a value obtained by dividing that of the first variable resistive element by that of the second variable resistive element is kept at $1/\alpha^2$, where a is a number smaller than one.

19. The complex band pass filter according to claim 1, further comprising:
a first voltage-to-current converting element connected to input side of the first active filter circuit; and
a second voltage-to-current converting element having equivalent impedance to the first voltage-to-current converting element and connected to input side of the second active filter circuit.

20. A receiver comprising the complex band pass filter according to claim 1.

* * * * *